United States Patent
Krishnan

(10) Patent No.: US 6,466,082 B1
(45) Date of Patent: Oct. 15, 2002

(54) CIRCUIT TECHNIQUE TO DEAL WITH FLOATING BODY EFFECTS

(75) Inventor: Srinath Krishnan, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/573,036

(22) Filed: May 17, 2000

(51) Int. Cl.[7] ............................................. G05F 3/02
(52) U.S. Cl. ..................................... 327/543; 257/347
(58) Field of Search ........................... 327/535, 537, 327/541, 543, 309; 257/347, 351, 369; 363/142; 320/31

(56) References Cited

U.S. PATENT DOCUMENTS

| | | | |
|---|---|---|---|
| 5,057,704 A | * 10/1991 | Koyanagoi et al. | 307/296.2 |
| 5,280,455 A | * 1/1994 | Kanaishi | 365/229 |
| 5,461,338 A | * 10/1995 | Hirayama et al. | 327/534 |
| 5,602,945 A | 2/1997 | Lou | 326/71 |
| 5,637,981 A | * 6/1997 | Nagai et al. | 320/31 |
| 5,663,629 A | * 9/1997 | Hinohara | 320/31 |
| 5,689,460 A | * 11/1997 | Ooishi | 327/530 |
| 6,124,752 A | * 9/2000 | Kuroda | 327/534 |
| 6,127,741 A | * 10/2000 | Matsuda et al. | 307/36 |
| 6,137,706 A | * 10/2000 | Nesbitt et al. | 363/142 |

FOREIGN PATENT DOCUMENTS

| | | | |
|---|---|---|---|
| KR | 1997-008718 | 3/1997 | G11C/7/00 |

* cited by examiner

Primary Examiner—Timothy P. Callahan
Assistant Examiner—Linh Nguyen
(74) Attorney, Agent, or Firm—Amin & Turocy, LLP

(57) ABSTRACT

A charge limiting system is provided that maintains the charge level of a body for a multiple MOSFET device structure. The multiple MOSFET device include a number of bodies linked to one another or a single body, such as a well, being employed for all devices. The single body or bodies are provided with at least one contact that extends to another layer, so that the body can be coupled to the charge limiting system. The charge limiting system includes a charge detector system that monitors the charge level on the body or bodies and a switching system for coupling the body or bodies to a fixed potential, if the charge level of the body or bodies reaches an unacceptable level. The switching system couples the body or bodies to ground for an npn type transistor and to $V_{DD}$ for pnp type transistors. The charge limiting system can include a timing device, so that the body can be coupled to the fixed potential for a predetermined period of time even after the charge level of the body or bodies falls below the threshold value. This ensures that the charge level on the body is sufficiently discharged.

22 Claims, 5 Drawing Sheets

CIRCUIT TECHNIQUE TO DEAL WITH FLOATING BODY EFFECTS

FIELD OF THE INVENTION

The present invention generally relates to the design of field effect transistors (FETS) and, more particularly, to a metal oxide silicon (MOS) transistor structure which facilitates mitigation of undesirable floating body effects, while retaining desirable floating body effects.

BACKGROUND OF THE INVENTION

As is known in the art, transistors such as metal oxide silicon (MOS) transistors, have been formed in isolated regions of a semiconductor body such as an epitaxial layer which was itself formed on a semiconductor, typically bulk silicon, substrate. With an n-channel MOS field effect transistor (FET), the body is of p-type conductivity and the source and drain regions are formed in the p-type conductivity body as $N^+$ type conductivity regions. With a p-channel MOSFET, the body, or epitaxial layer, is of n-type conductivity and the source and drain regions are formed in the n-type conductivity body as $P^+$ type conductivity regions. It has been suggested that the semiconductor body, or layer, be formed on an insulating substrate, or over an insulation layer formed in a semiconductor substrate. Such technology sometimes is referred to as Silicon-on-Insulator (SOI) technology. Silicon-on-Insulator MOS technologies have a number of advantages over bulk silicon MOS transistors. These advantages include: reduced source/drain capacitance and hence improved speed performance at higher-operating frequencies; reduced $N^+$ to $P^+$ spacing and hence higher packing density due to ease of isolation; and higher "soft error" upset immunity (i.e., the immunity to the effects of alpha particle strikes).

Silicon-on-Insulator technology is characterized by the formation of a thin silicon layer for formation of the active devices over an insulating layer, such as an oxide, which is in turn formed over a substrate. Transistor sources in drains are formed by, for example, implantations into the silicon layer while transistor gates are formed by forming a patterned oxide and conductor (e.g. metal) layer structure. Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). However, the floating body can introduce dynamic instabilities in the operation of such a transistor.

An SOI field effect transistor combines two separated immunity groups, generally formed by implantation, constituting the source and drain of the transistor with the general region (device body) between them covered by a thin gate insulator and a conductive gate. Typically no electrical connection is made to the channel region and therefore the body is electrically floating. Because the source and drain regions normally extend entirely through the thin silicon layer, the electrical potential of the body is governed by Kirchoffs current law, wherein the sum of the currents flowing into the body equals the sum of the currents flowing out of the body. Because the channel potential is dependent on the body voltage, the device threshold voltage varies as a function of the body voltage.

The boundaries between the channel region and the source and drain, respectively, form junctions which are normally reversed biased. Conduction in the channel region normally occurs immediately below the gate insulator in the region in which depletion can be controlled by a gate voltage. However, the junctions at the boundary of the source and drain also form a parasitic lateral bipolar transistor, which, in effect exists somewhat below the field effect transistor and may supplement desired channel current. On the other hand, the parasitic bipolar device cannot be controlled and under some bias conditions, the operation of the parasitic bipolar device may transiently dominate the operation of the field effect transistor and effectively occupy substantially the entire silicon layer at times when the channel current is not desired.

When the device is switching, the body is coupled to various terminals of the device because there are capacitances between the body and gate, body and source, and body and drain respectively. When the voltage at the various terminal changes, the body voltage changes as a function of time which in turn effects the device threshold voltage. In certain cases, this relationship may be harmful to a device (e.g., inverter). For example, when the gate of an inverter is switched on the drain is discharged (which is typically the output of the inverter)—thus the drain voltage falls when the gate is switched ON. Because the drain and body are capacitively coupled, when the drain voltage drops so does the body voltage. There is an inverse relationship between the body voltage and the threshold voltage. For an NMOS device, when the body voltage falls, the device threshold voltage increases. When the body voltage increases the threshold voltage decreases. Thus, the capacitive coupling between the drain and the body results in the device losing drive current as the device is being switched.

In SOI transistors there is a lack of a bulk silicon or body contact to the MOS transistor. In some devices, it is desirable to connect the p-type conductivity body in the case of an n-channel MOSFET, or the n-type conductivity body in the case of a p-channel MOSFET, to a fixed potential. This prevents various hysteresis effects associated with having the body potential "float" relative to ground. With bulk silicon MOSFETs such is relatively easy because the bottom of the bulk silicon can be easily electrically connected to a fixed potential.

SOI devices also exhibit a kink effect which originates from impact ionization. When an SOI MOSFET is operated at a relatively large drain-to-source voltage, channel electrons with sufficient energy cause impact ionization near the drain end of the channel. The generated holes build up in the body of the device, thereby raising the body potential. The increased body potential reduces the threshold voltage of the MOSFET. This increases the MOSFET current and causes the so-called "kink" in SOI MOSFET current vs. voltage (I-V) curves.

With regard to the lateral bipolar action, if the impact ionization results in a large number of holes, the body bias may be raised sufficiently so that the source region to body p-n junction is forward biased. The resulting emission of minority carriers into the body causes a parasitic npn bipolar transistor between source, body and drain to turn on, leading to loss of gate control over the MOSFET current.

One way to eliminate floating body effects of an SOI MOSFET device is to couple the body or bodies to ground for an npn MOSFET device or to couple the body or bodies to $V_{DD}$ for a pnp MOSFET device. However, MOSFET devices with bodies tied to a fixed potential do not perform as well as MOSFET devices with floating bodies. In view of the above, it is apparent that there is a need in the art for a device which mitigates some of the negative effects mentioned above, relating to floating body effects, while retaining the beneficial attributes of floating body effects.

SUMMARY OF THE INVENTION

The present invention provides for a system and method for limiting the charge level on a body of an SOI MOSFET device at or below a threshold level. The body of the SOI MOSFET device floats when it is at a charge level below the threshold level. However, the body is coupled to a fixed voltage reference upon reaching the threshold level of the MOSFET device. The body of the MOSFET device will discharge excess charge into the fixed voltage reference. The body is then disconnected from the fixed voltage reference allowing for the body to return to its floating state. The device of the present invention mitigates some of the aforementioned problems associated with floating body effects of MOSFET devices, while retaining the benefits associated with floating body effects.

The present invention employs a charge limiting system that maintains the charge level of the body for a multiple MOSFET device structure. The multiple MOSFET device include a number of bodies linked to one another or a single body, such as a well, being employed for all devices. The single body or bodies are provided with at least one contact that extends to another layer, so that the body can be coupled to the charge limiting system. The charge limiting system includes a charge detector system that monitors the charge level on the body or bodies and a switching system for coupling the body or bodies to a fixed potential, if the charge level of the body or bodies reaches an unacceptable level. The switching system couples the body or bodies to ground for an npn type transistor and to $V_{DD}$ for pnp type transistors. The charge limiting system can include a timing device, so that the body can be coupled to the fixed potential for a predetermined period of time even after the charge level of the body or bodies falls below the threshold value. This ensures that the charge level on the body is sufficiently discharged.

One aspect of the invention relates to a system for limiting the charge on at least one body of at least one transistor device on an SOI MOSFET structure. The SOI MOSFET structure includes a contact coupled to the at least one body. The system comprises a charge detector system adapted to measure the charge on the at least one body via the contact and transmit a signal in response to a charge measurement above a threshold level. The system further comprises a switch system adapted to receive the signal and connect the at least one body via the contact to a fixed reference voltage.

Another aspect of the invention relates to a method of limiting the charge on at least one body of at least one transistor device on an SOI MOSFET structure. The method comprises the steps of monitoring the charge on the at least one body to determine a charge level of the at least one body and connecting the at least one body to a fixed reference voltage, if the charge level on the at least one body is above a threshold level.

Yet another aspect of the invention relates to a system for limiting the charge on a plurality of linked bodies of a plurality of transistor devices on an SOI MOSFET structure. The system comprises a connector coupled to at least one of the plurality of linked bodies and a charge detector system coupled to the contact. The charge detector system is adapted to measure the charge on the at least one body via the contact and transmit a signal in response to a charge measurement above a threshold level. The system further comprises a switch system adapted to receive the signal and connect the at least one body via the contact to a fixed reference voltage.

Another aspect of the invention relates to a system for limiting the charge on at least one body of at least one transistor device on an SOI MOSFET structure. The SOI MOSFET structure includes a contact coupled to the at least one body. The system comprises means for monitoring the charge on the at least one body to determine a charge level of the at least one body and means for connecting the at least one body to a fixed reference voltage, if the charge level on the at least one body is above a threshold level.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
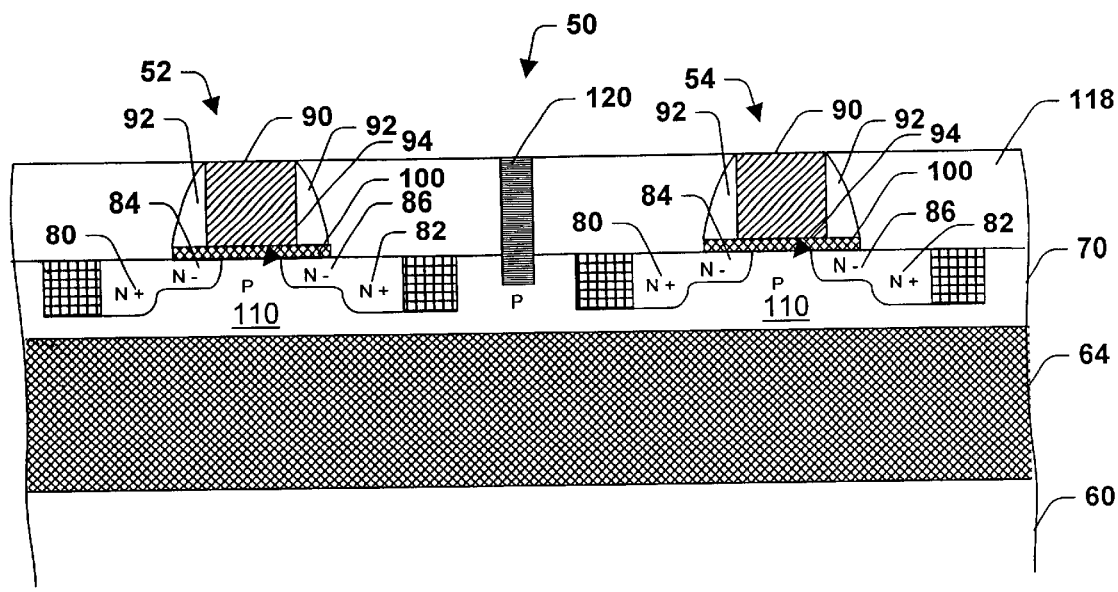
FIG. 1 is a schematic cross-sectional illustration of an NMOS SOI structure in accordance with one aspect of the present invention.

The present invention relates to a MOSFET device structure which facilitates mitigation of adverse floating body effects, while retaining desirable floating body effects. The MOSFET device of the present invention exhibits faster performance, lower power consumption and less device hysteresis than many conventional MOSFET devices. The present invention will now be described with reference to the drawings, wherein like reference numerals are used to refer to like elements throughout. Although the present invention is described primarily in connection with an SOI MOSFET device structure, the present invention may be employed in connection with bulk MOSFET device structures as well. It is to be understood that the description of this preferred embodiment is merely illustrative and that it should not be taken in a limiting sense.

FIG. 1 is a schematic cross-sectional illustration of an SOI MOSFET multiple device structure 50 in accordance with the present invention. The multiple device structure 50 includes a base 60 comprising silicon, for example. The base 60 provides mechanical support for the multiple device structure 50, and is of a thickness suitable for providing such support. A dielectric layer 64 (e.g., $SiO_2$, $Si_3N_4$) is formed over the base 60. The thickness of the dielectric layer 64 is preferably within the range of 1000 Å to 5000 Å. A top silicon layer 70 is shown formed over the dielectric layer 64, and the top silicon layer preferably has a thickness within the range of 500 Å to 2000 Å. The top silicon layer 70 becomes the active region for device fabrication. The multiple device structure 50 includes a first transistor device 52 and a second transistor device 54. It is to be appreciated that the present invention can employ a single transistor device or any number of transistor devices.

Each transistor device 52, 54 is an NMOS type device and further includes an $N^+$ drain region 80, an $N^+$ source region 82, an $N^-$ lightly doped drain extension region 84, and an $N^-$ lightly doped source extension region 86. Each NMOS type device 52 and 54 includes a gate 90 (formed between two sidewall spacers 92) and p-type channel 94, and a gate oxide layer 100 formed between the gate 90 and the channel 94. An oxide layer 118 serves to protect the devices 52 and 54 from contaminants, etc.

The area under the channel 94 and between the source/drain regions 80, 82 and between the source/drain extension regions 84, 86 of the devices 52 and 54 is a p-type body 110. The source/drain regions 80, 82 and source/drain extension regions 84, 86 are partially etched into the top silicon layer 70, such that the body 110 of both devices are linked under the devices 52 and 54. In one specific aspect of the present invention, the lightly doped source/drain extension regions include an arsenic implant having a dose in the range of $1 \times 10^{14}$ to $1 \times 10^{16}$ atoms/cm$^2$ and implanted at an energy range of about 1 KeV to about 100 KeV. The source and drain regions 80, 82 include an arsenic implant having a dose within the range of $1 \times 10^{14}$ to $1 \times 10^{14}$ atoms/cm$^2$ at an energy range of about 1 KeV to about 100 KeV. Arsenic is employed to make a substantially shallow junction because of its heavy nature and less tendency to move. The p-type body 110 includes a $P^+$ implant (e.g., boron) having a dose concentration within the range of $1 \times 10^{10}$ to $1 \times 10^{14}$ atoms/cm$^2$.

A single contact 120 is provided extending through the oxide layer 118. The single contact 120 allows for coupling the bodies of both devices to other components for controlling the floating body effects of the devices 52 and 54. Although, the contact 120 is illustrated as extending through oxide layer 118, a contact 120 can be provided to extend though dielectric layer 64 and base 60 for connecting the body 110 to components disposed a layer below devices 52 and 54. Additionally, although a single contact may be used in carrying out the present invention, it is to be appreciated that in some circumstances the use of multiple contacts may be employed to achieve optimal results when utilizing a large number of devices.

Figure 2:
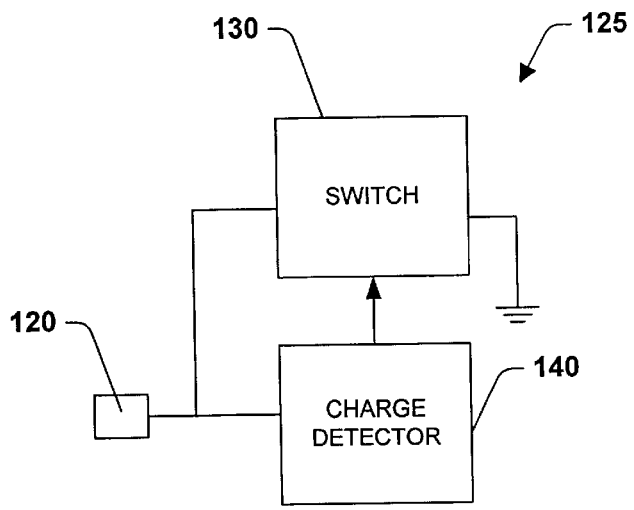
FIG. 2 is a block diagram of a charge limiting system for the NMOS SOI structure of FIG. 1 in accordance with one aspect of the present invention.

FIG. 2 illustrates a schematic diagram of a charge limiting system 125 that can be coupled to the contact 120. The charge limiting system 125 includes a switch system 130 and a charge detector system 140. The charge detector system 140 monitors the amount of charge on the floating body 110 through the contact 120. If the charge rises above a threshold value, the charge detector system 140 transmits a signal to the switch system 130. The switch system 130 then connects the contact 120 to ground causing the excess charge of the body 110 to discharge until the charge on the body 110 reaches an acceptable level. Once the body 110 reaches an acceptable charge level, the switching system 130 disconnects the body 110 from ground via the contact 120.

Figure 3:
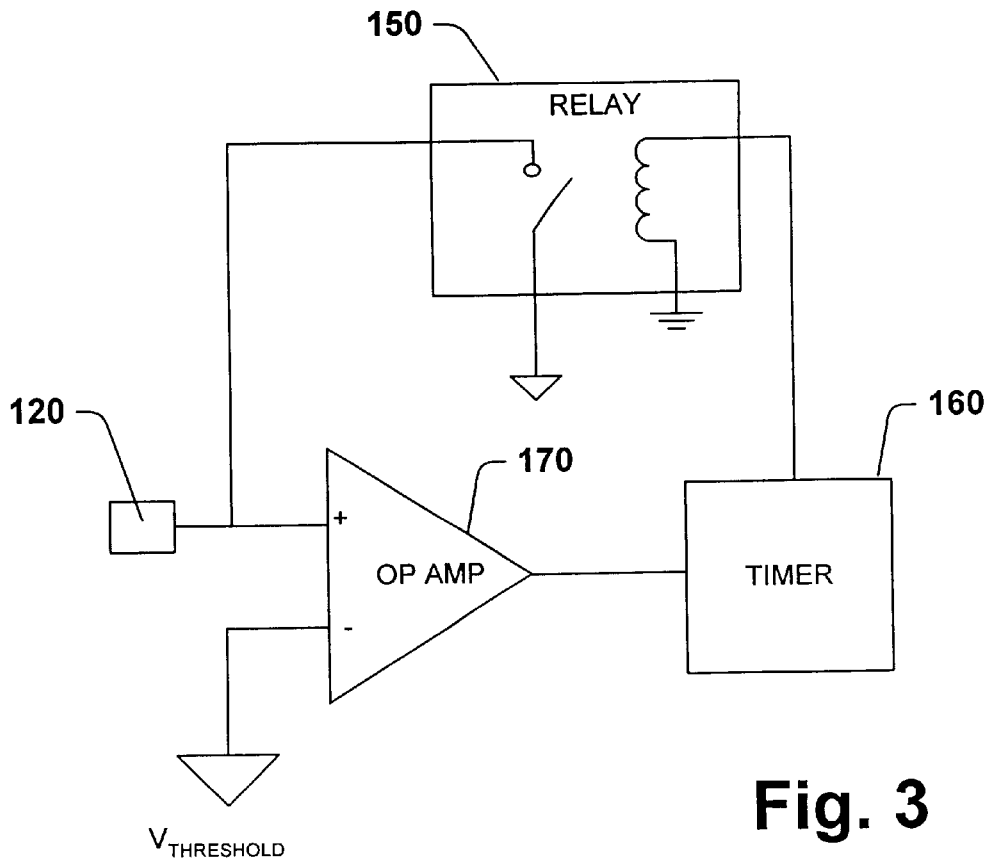
FIG. 3 is a schematic diagram of a circuit for performing the functions of the charge limiting system illustrated in FIG. 2 in accordance with one aspect of the present invention.

A typical threshold value for a body of an NMOS device is 0.4–0.5 volts. The threshold value is the voltage level that the body will need to stay below to ensure reliability of the device. A comparator device can be employed to monitor the voltage level of the body 110. FIG. 3 illustrates utilizing an operational amplifier 170 as a compartor device for monitoring the voltage level of the body 110 of structure 50. The positive terminal of the operations amplifier 170 is coupled to the connector 120. The negative terminal of the operational amplifier 170 is coupled to a reference voltage equal to the threshold voltage of the body of transistor devices 52 and 54. If the voltage level of the body 110 exceeds the threshold voltage of the devices 52 and 54, the operational amplifier 170 will change states and transmit a signal to a timer device 160. The timer device 160 is coupled to a normally open relay device 150. The timer device 160 will cause the relay switch in the relay device 150 to close for a predetermined period of time, until the body 110 discharges the excess charge. The relay device 150 will then return to its normally open state after a time period determined by the timer device 160.

Figure 4:
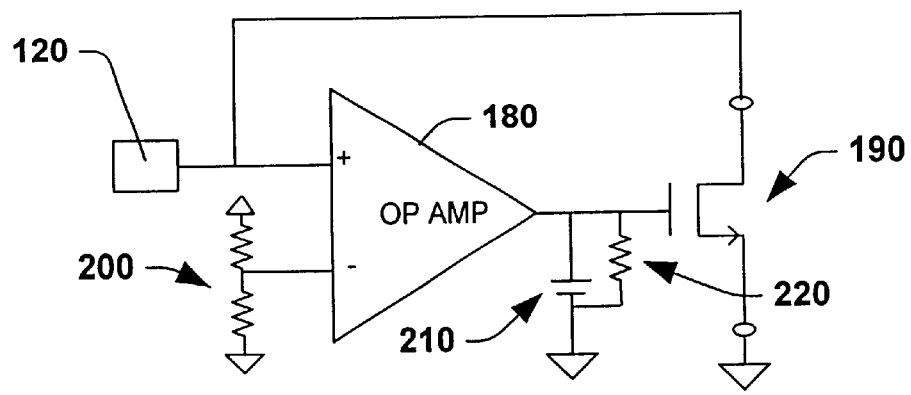
FIG. 4 is a schematic diagram of an alternate circuit for performing the functions of the charge limiting system illustrated in FIG. 2 in accordance with one aspect of the present invention.

FIG. 4 illustrates an alternate arrangement for maintaining the body 110 of the structure 50 below a certain threshold level. The system of FIG. 4 utilizes an operational amplifier 180 as a comparator device for monitoring the voltage level of the body 110 of structure 50. The positive terminal of the operation amplifier 180 is coupled to the connector 120. The negative terminal of the operational amplifier is coupled to a reference voltage set by a voltage divider circuit 200. The voltage divider circuit 200 provides a reference voltage equal to the threshold voltage of the transistor devices 52 and 54. The output of the operational amplifier 180 is connected to a resistor 220 and capacitor 210 circuit and to a gate of an NMOS field effect transistor 220.

If the voltage level of the body 110 exceeds the threshold voltage of the device, the operational amplifier 180 will change to a high state and charge the capacitor 210, thus providing a high state to the gate of the transistor 190. This will cause the transistor 190 to turn on allowing the body 110 to discharge through the transistor 190. Once the body 120 falls below the threshold voltage, the state of the operational amplifier will change to a low state. The resistor 220 and capacitor circuit will act as a timer device to ensure that the transistor 190 remains on for a certain period of time, thus allowing the body 110 to discharge sufficiently. It is to be appreciated that the capacitor 220 can be eliminated and the junction capacitance of the transistor 190 in conjunction with the resistor 220 be employed to implement the timing device 160.

Figure 5:
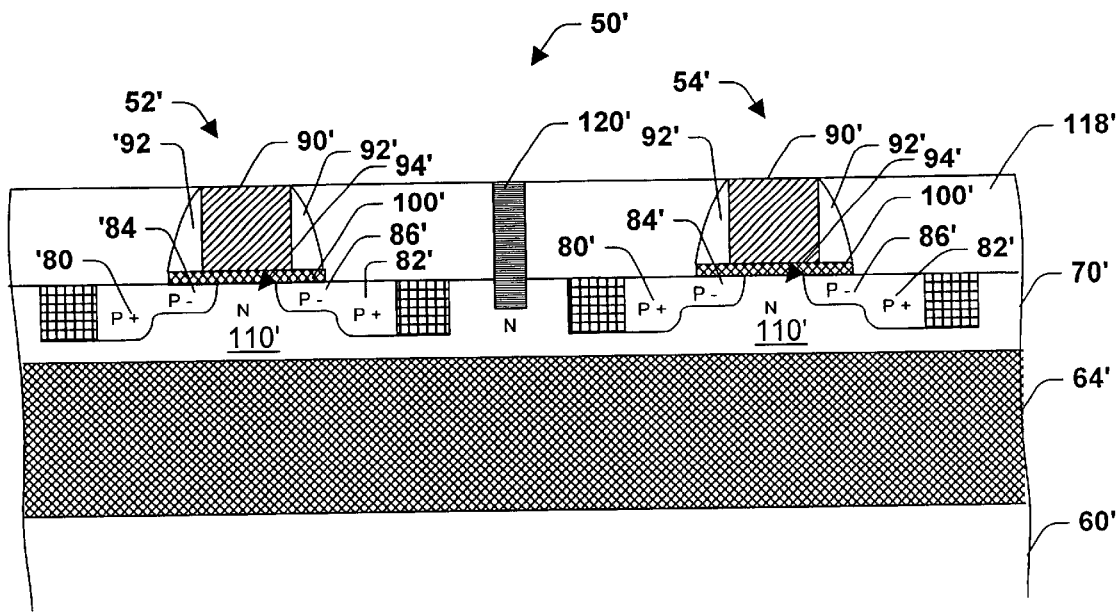
FIG. 5 is a schematic cross-sectional illustration of a PMOS SOI structure in accordance with one aspect of the present invention.

The present invention may be employed in a PMOS structure. FIG. 5 illustrates a PMOS structure were similar parts with respect to the device illustrated in FIG. 1 are denoted by similar reference numerals except that a (') denotes elements of the PMOS structure. FIG. 5 is a schematic cross-sectional illustration of an SOI MOSFET multiple device structure 50' in accordance with the present invention. The multiple device structure 50' includes a base 60' comprising silicon, for example. The base 60' provides mechanical support for the multiple device structure 50', and is of a thickness suitable for providing such support. A dielectric layer 64' (e.g., $SiO_2$, $Si_3N_4$) is formed over the base 60'. The thickness of the dielectric layer 64' is preferably within the range of 1000 Å to 5000 Å. A top silicon layer 70' is shown formed over the dielectric layer 64', and the top silicon layer preferably has a thickness within the range of 500 Å to 2000 Å. The top silicon layer 70' becomes the active region for device fabrication. The multiple device structure 50' includes a first transistor device 52' and a second transistor device 54'. It is to be appreciated that the present invention can employ a single transistor device or any number of transistor devices.

Each transistor device 52', 54' is a PMOS type device and further includes a $P^+$ drain region 80', a $P^+$ source region 82', a $P^-$ lightly doped drain extension region 84', and a $P^-$ lightly doped source extension region 86'. Each PMOS type device 52' and 54' includes a gate 90' (formed between two sidewall spacers 92') and n-type channel 94', and a gate oxide layer 100' formed between the gate 90' and the channel 94'. An oxide layer 118' serves to protect the devices 52' and 54' from contaminants, etc.

The area under the channel 94' and between the source/drain regions 80', 82' and between the source/drain extension regions 84', 86' of the devices 52' and 54' is an n-type body 110'. The source/drain regions 80', 82' and source/drain extension regions 84', 86' are partially etched into the top silicon layer 70', such that the body 110' of both devices are connected under the devices 52' and 54'. In one specific aspect of the present invention, the lightly doped source/drain extension regions include a boron implant having a dose in the range of $1 \times 10^{14}$ to $1 \times 10^{16}$ atoms/cm$^2$ and implanted at an energy range of about 1 KeV to about 100 KeV. The source and drain regions 80, 82 include a boron implant having a dose within the range of $1 \times 10^{14}$ to $1 \times 10^{14}$ atoms/cm$^2$ at an energy range of about 1 KeV to about 100 KeV. The p-type body 110 includes an $N^+$ implant (e.g., arsenic, phosporous) having a dose concentration within the range of $1 \times 10^{10}$ to $1 \times 10^{14}$ atoms/cm$^2$.

A single contact 120' is provided extending through the oxide layer 118'. The single contact 120' allows for coupling the bodies of both devices to other components for controlling the floating body effects of the devices 52' and 54'. Although, the contact is illustrated as extending through oxide layer 118', a contact can be provided to extend though dielectric layer 64' and base 60' for connecting the body 110' to components disposed a layer below devices 52' and 54'. Additionally, although a single contact may be used in carrying out the present invention, it is to be appreciated that in some circumstances the use of multiple contacts may be employed to achieve optimal results when utilizing a large number of devices.

Figure 6:
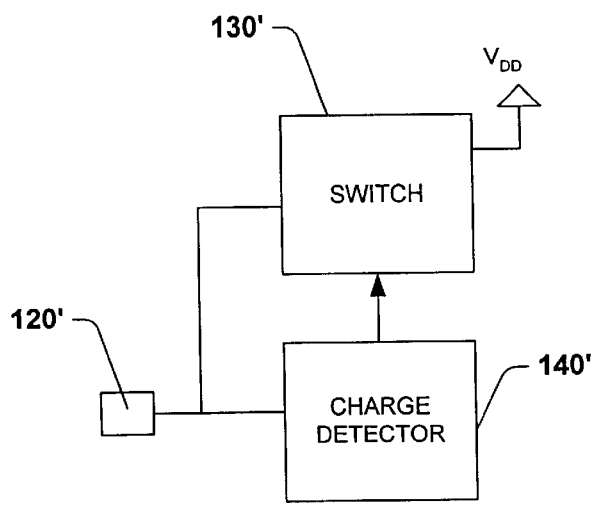
FIG. 6 is a block diagram of a charge limiting system for the PMOS SOI structure of FIG. 5 in accordance with one aspect of the present invention.

FIG. 6 illustrates a schematic diagram of a charge limiting system 125' that can be coupled to the contact 120'. The charge limiting system 125' includes a switch system 130' and a charge detector system 140'. The charge detector system 140' monitors the amount of charge on the floating body 110' through the contact 120'. If the charge reaches a threshold value, the charge detector system 140' transmits a signal to the switch system 130'. The switch system 130' then connects the contact 120' to $V_{DD}$ (Drain voltage) causing the excess charge of the body 110' to discharge until the charge on the body 110' reaches an acceptable level. Once the body 110' reaches an acceptable charge level, the switching system 130' disconnects the body 110 from $V_{DD}$ via the contact 120.

Figure 7:
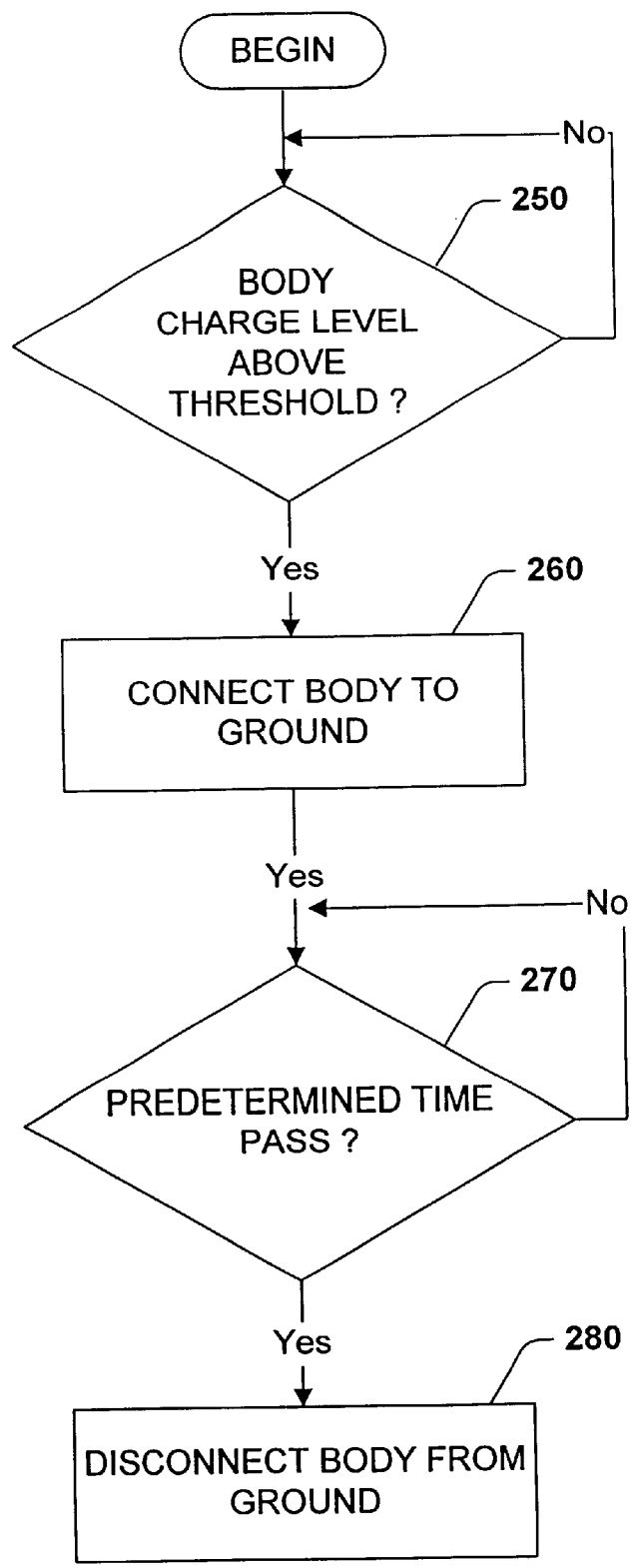
FIG. 7 is a flow diagram illustrating a methodology for employing the charge limiting system of FIG. 2 in accordance with one aspect of the present invention.

FIG. 7 illustrates a methodology for ensuring that the NMOS multiple device structure 50 maintains a body charge level below a threshold level. At step 250, the charge limiting system 125 determines if the body 110 of the structure 50 is above the threshold level. If the body 110 of the structure 50 is not above the threshold level (No), the charge limiting system 125 repeats step 250. If the body 110 of the structure 50 is above the threshold level (Yes), the charge limiting system 125, connects the body 110 to ground at step 260. At step 270, the charge limiting system 125, waits a predetermined period of time. If the predetermined period of time has not passed (No), the charge limiting system 125 repeats step 270. If the predetermined period of time has passed (Yes), the charge limiting system 125 advances to step 280 and disconnects the body 110 from ground.

Figure 8:
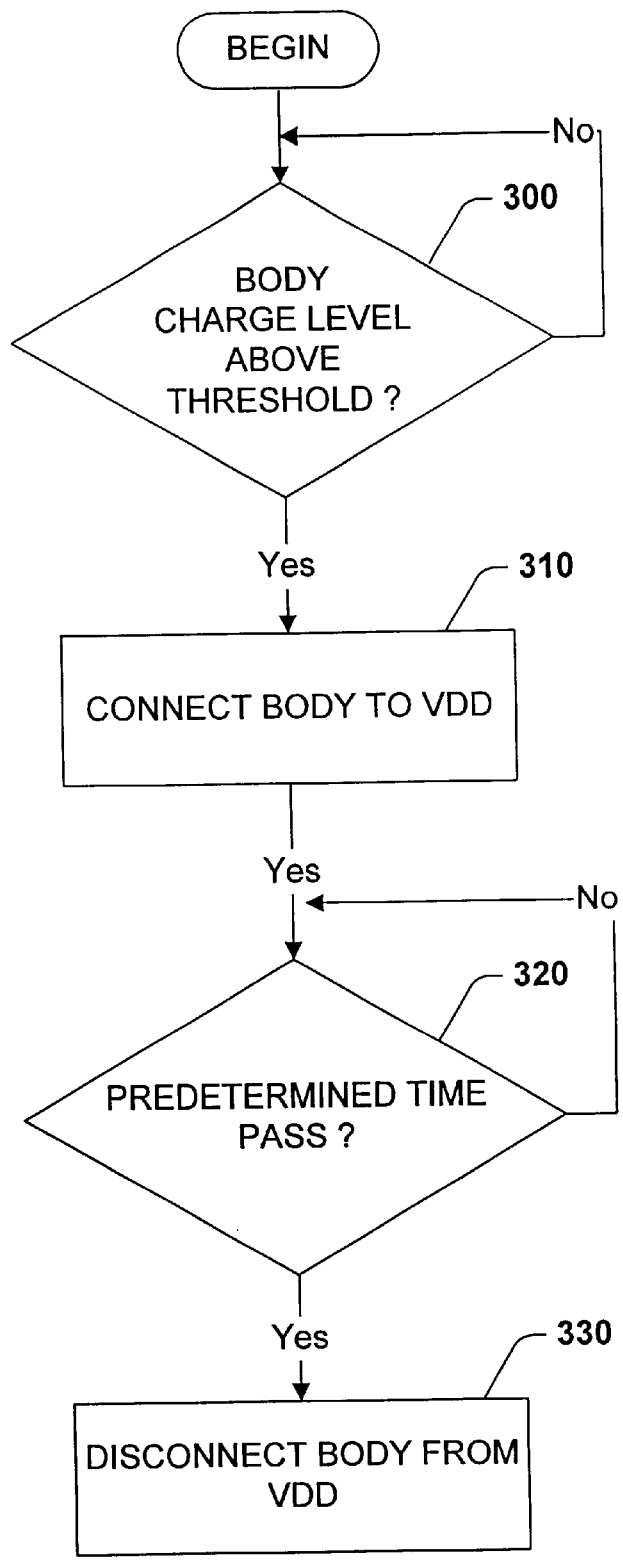
FIG. 8 is a flow diagram illustrating a methodology for employing the charge limiting system of FIG. 6 in accordance with one aspect of the present invention.

FIG. 8 illustrates a methodology for ensuring that the PMOS multiple device structure 50' maintains a body charge level below a threshold level. At step 300, the charge limiting system 125' determines if the body 110' of the structure 50' is above the threshold level. If the body 110' of the structure 50' is not above the threshold level (No), the charge limiting system 125' repeats step 300. If the body 110' of the structure 50' is above the threshold level (Yes), the charge limiting system 125' connects the body to $V_{DD}$ at step 310. At step 320, the charge limiting system 125', waits a predetermined period of time. If the predetermined period of time has not passed (No), the charge limiting system 125' repeats step 320. If the predetermined period of time has passed (Yes), the charge limiting system 125' advances to step 330 and disconnects the body from $V_{DD}$.

Substantially the same implementation methodology may be employed in the implementations of such an n-channel device or a p-channel device as a bulk device as compared to the discussed SOI type device. One skilled in the art could readily tailor the above steps to employ such n-channel or p-channel devices based on the discussion herein, and therefore further discussion related thereto is omitted for sake of brevity.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for limiting the charge on at least one body of at least one transistor device on an SOI MOSFET structure, the SOI MOSFET structure including a contact coupled to the at least one body, the system comprising:

charge detector system that measures the charge on the at least one body via the contact and transmits a signal in response to a charge measurement above a threshold level;

a switching system adapted to connect the at least one body via the contact to a fixed reference voltage; and a timer device that receives the signal from the charge detector system and cause the switching system to connect the at least one body via the contact to the fixed reference voltage for a predetermined period of time to facilitate the charge level on the body being sufficiently discharged to an acceptable charge level below the threshold level to mitigate problems associated with floating body effects of the SOI MOSFET, the switching system disconnects the at least one body from the fixed reference voltage after the predetermined period of time to retain the benefits associated with floating body effects of the SOI MOSFET at the acceptable charge level.

2. The system of claim 1, the at least one transistor device being an NMOS device and the fixed reference voltage being ground.

3. The system of claim 1, the at least one transistor device being a PMOS device and the fixed reference voltage being $V_{DD}$.

4. The system of claim 1, the charge detector system being a comparator device.

5. The system of claim 4, the comparator device including a first input terminal coupleable to the contact and a second input terminal coupled to the fixed reference voltage.

6. The system of claim 1, the fixed reference voltage being provided by a voltage divider circuit.

7. The system of claim 1, the switching system further comprising a transistor device.

8. The system of claim 7, the timer device adapted to receive the signal from the charge detector system and turn the transistor on for a predetermined period of time, so that the transistor will connect the at least one body via the contact to the fixed reference voltage for the predetermined period of time.

9. The system of claim 8, the timing device being a resistor and capacitor circuit.

10. The system of claim 1, the timing device being a resistor and capacitor circuit.

11. The system of claim 1, the at least one body of the at least one transistor device comprising a plurality of transistor devices each having a body linked to one another.

12. The system of claim 11, the linked bodies comprising a single well.

13. A method of limiting the charge on at least one body of at least one transistor device on an SOI MOSFET structure comprising the steps of:

monitoring the charge on the at least one body to determine a charge level of the at least one body;

connecting the at least one body to a fixed reference voltage when the charge level on the at least one body is above a threshold level;

waiting a predetermined period of time based on a time constant associated with a timing device so that the body can reach an acceptable charge level below the threshold level to mitigate problems associated with floating body effects of the SOI MOSFET structure; and disconnecting the at least one body from the reference voltage after the predetermined period of time to retain the benefits associated with floating body effects at the acceptable charge level.

14. The method of claim 13, the at least one transistor device being an NMOS device and the fixed reference voltage being ground.

15. The method of claim 13, the at least one transistor device being a PMOS device and the fixed reference voltage being $V_{DD}$.

16. The method of claim 13, the at least one body of the at least one transistor device comprises a plurality of transistor devices each having a body linked to one another.

17. The method of claim 13, further comprising transmitting a signal to the timing device when the charge level on the at least one body is above a threshold level causing the connecting of the at least one body to a fixed reference voltage.

18. A system for limiting the charge on a plurality of linked bodies of a plurality of transistor devices on an SOI MOSFET structure comprising:

connector coupled to at least one of the plurality of linked bodies;

a charge detector system that measures the charge on the at least one body via the contact and transmits a signal in response to a charge measurement above a threshold level;

a switch system operable to connect the at least one body via the contact to a fixed reference voltage; and a timer device that receives the signal from the charge detector system and causes the switch system to connect the at least one body via the contact to the fixed reference voltage for a predetermined period of time to facilitate the charge level on the body being sufficiently discharged to an acceptable charge level below the threshold level to mitigate problems associated with floating body effects of the SOI MOSFET structure, the switching system disconnects the at least one body from the fixed reference voltage after the predetermined period of time to retain the benefits associated with floating body effects of the SOI MOSFET structure at the acceptable charge level.

19. The system of claim 18, the at least one transistor device being an NMOS device and the fixed reference voltage being ground.

20. The system of claim 19, the at least one transistor device being a PMOS device and the fixed reference voltage being $V_{DD}$.

21. A system for limiting the charge on at least one body of at least one transistor device on an SOI MOSFET structure comprising:

means for monitoring the charge on the at least one body to determine a charge level of the at least one body;

means for connecting the at least one body to a fixed reference voltage when the charge level on the at least one body is above a threshold level; and means for controlling the period of time that the means for connecting connects the at least one body to a fixed reference voltage, the means for controlling the period of time being adapted to receive a signal from the means for monitoring and cause the means for connecting to connect the at least one body to the fixed reference voltage for a predetermined period of time to facilitate the charge level on the body being sufficiently discharged to an acceptable charge level below the threshold level to mitigate problems associated with floating body effects of the SOI MOSFET structure, the switching system disconnects the at least one body from the fixed reference voltage after the predetermined period of time to retain the benefits associated with floating body effects of the SOI MOSFET structure at the acceptable charge level.

22. The system of claim 21, the at least one body of the at least one transistor device comprises a plurality of transistor devices each having a body linked to one another.

* * * * *